United States Patent
Park et al.

(10) Patent No.: US 8,055,228 B2
(45) Date of Patent: Nov. 8, 2011

(54) RECEIVED SIGNAL STRENGTH INDICATOR SELF-CALIBRATING GAIN OF LIMITER

(75) Inventors: Kyoung Seok Park, Gyunggi-Do (KR);
Hyun Hwan Yoo, Suwon (KR); Yoo Sam Na, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 592 days.

(21) Appl. No.: 12/200,924

(22) Filed: Aug. 28, 2008

(65) Prior Publication Data

US 2009/0058524 A1 Mar. 5, 2009

(30) Foreign Application Priority Data

Sep. 3, 2007 (KR) .................... 10-2007-0089111

(51) Int. Cl.
*H04B 17/00* (2006.01)

(52) U.S. Cl. ............... 455/226.1; 455/226.2; 455/226.4; 455/67.7; 455/232.1; 327/350; 327/351; 327/352; 327/357

(58) Field of Classification Search .... 455/232.1–253.1, 455/127.1–127.3, 136, 226.1, 226.2, 226.4, 455/67.7; 375/297, 345; 330/129, 254, 278; 327/350, 351, 352, 357
See application file for complete search history.

(56) References Cited

U.S. PATENT DOCUMENTS

| | | | | |
|---|---|---|---|---|
| 5,298,811 | A * | 3/1994 | Gilbert | 327/351 |
| 5,521,542 | A * | 5/1996 | Kimura | 327/352 |
| 5,893,028 | A * | 4/1999 | Brehmer et al. | 455/313 |
| 7,133,655 | B2 * | 11/2006 | Chiu | 455/226.4 |
| 7,187,914 | B2 * | 3/2007 | Chiu | 455/226.2 |
| 7,565,124 | B2 * | 7/2009 | Lee et al. | 455/234.1 |
| 7,639,998 | B1 * | 12/2009 | Halvorson | 455/251.1 |

* cited by examiner

*Primary Examiner* — Junpeng Chen
(74) *Attorney, Agent, or Firm* — Lowe, Hauptman, Ham & Berner, LLP

(57) ABSTRACT

A received signal strength indicator according to an aspect of the invention may include a gain calibration section including a calibration limiter, a calibration load unit and a comparison and adjustment unit. The calibration load unit is connected to output terminals of the calibration limiter, and generating an output differential voltage whose gain is a unit gain when a predetermined input differential voltage is input to the calibration limiter, and a comparison and adjustment unit comparing the input differential voltage with the output differential voltage, and adjusting an output of a variable current source included in the calibration limiter so that the input differential voltage becomes identical to the output differential voltage.

11 Claims, 7 Drawing Sheets

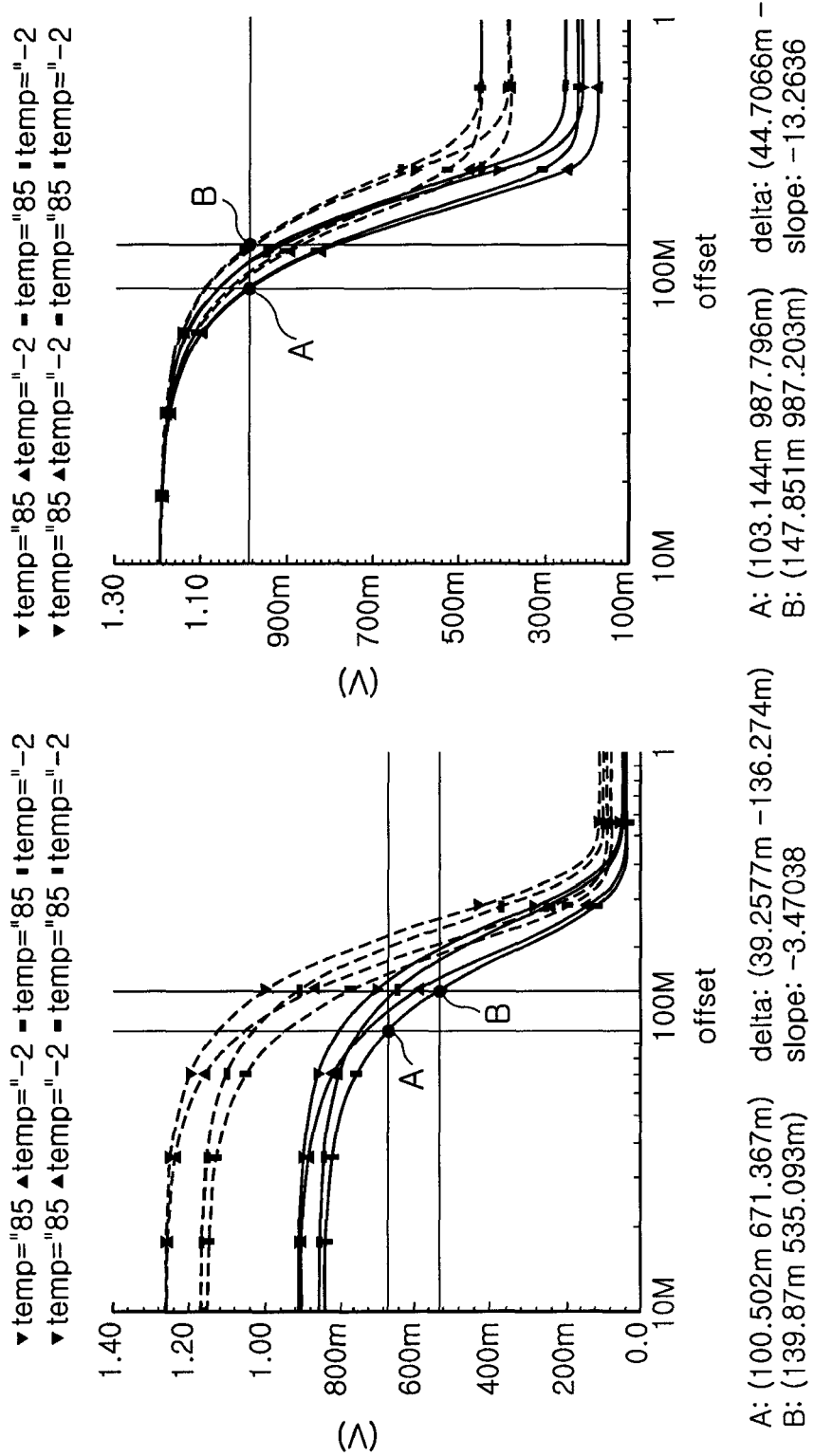

US 8,055,228 B2

RECEIVED SIGNAL STRENGTH INDICATOR SELF-CALIBRATING GAIN OF LIMITER

CROSS-REFERENCE TO RELATED APPLICATIONS

This application claims the priority of Korean Patent Application No. 2007-0089111 filed on Sep. 3, 2007, in the Korean Intellectual Property Office, the disclosure of which is incorporated herein by reference.

BACKGROUND OF THE INVENTION

1. Field of the Invention

The present invention relates to received signal strength indicators (hereinafter, also referred to as an "RSSI") detecting the power of an RF signal and the like, and more particularly, to received signal strength indicators self-calibrating a gain of a limiter to maintain a constant gain over internal and external variations, such as temperature and process variations.

2. Description of the Related Art

In general, a received signal strength indicator (RSSI) is used to detect the power of an RF signal that is received from a receiver. The RSSI includes a multi-stage amplifier and a plurality of rectifiers. The multi-stage amplifier includes a plurality of limiters connected in series to each other to amplify the received signal in multiple stages. The plurality of rectifiers rectify individual outputs of the limiters included in the multi-stage amplifier, and generate a voltage having a magnitude corresponding to the strength of the received signal. The RSSI may be used for gain calibration of the entire RF system by using a feedback structure.

The RSSI may be manufactured as an RF IC by using a semiconductor process. Because of characteristics of an analog circuit implemented as the RF IC, the characteristics can be changed due to temperature or process variations. For example, variations may occur in the gain of the limiter included in the RSSI, and variations may occur in a direct current output of the rectifier.

Therefore, in the RSSI-related technical field, there has been required a method of calibrating a gain of a limiter and a direct current output of a rectifier according to temperature or process deviations.

SUMMARY OF THE INVENTION

An aspect of the present invention provides a received signal strength indicator self-calibrating variations of a gain of a limiter that is caused by temperature or process variations, and also provides a received signal strength indicator self-calibrating variations of a direct current output of a rectifier that is caused by temperature or process variations.

According to an aspect of the present invention, there is provided a received signal strength indicator including: a multi-stage amplification section including a plurality of limiters connected in series to each other and individually having variable current sources calibrating gains; a rectification section receiving and rectifying an output of each of the plurality of limiters, and outputting a direct current corresponding to the output; a load resistor converting the direct currents output from the plurality of rectifiers into a voltage; and a gain calibration section including: a calibration limiter equal to the limiter included in the multi-stage amplification section; a calibration load unit connected to output terminals of the calibration limiter, and generating an output differential voltage whose gain is a unit gain when a predetermined input differential voltage is input to the calibration limiter; and a comparison and adjustment unit comparing the input differential voltage with the output differential voltage, and adjusting an output of a variable current source included in the calibration limiter so that the input differential voltage becomes identical to the output differential voltage, wherein the adjustment current generated from the gain calibration section is supplied to the variable current sources of the plurality of limiters included in the multi-stage amplification section.

The input differential voltage may have a magnitude within a range where the calibration limiter performs a linear operation.

The calibration load unit may include a plurality of resistors connected in series to each other between the output terminals of the calibration limiter.

The plurality of resistors may include: a first resistor having one end connected to one output terminal of the calibration limiter; a second resistor having one end connected to the other end of the first resistor; a third resistor having one end connected to the other end of the second resistor; and a fourth resistor having one end connected to the other end of the third resistor and the other end connected to the other output terminal of the calibration limiter, and the first and fourth resistors have the same magnitude, the second and third resistors have the same magnitude, and a voltage at a connection node between the first and second resistors and a voltage at a connection node between the third and fourth resistors become the output differential voltages.

The comparison and adjustment unit may include: a Gilbert cell removing a common mode voltage component of each of the input differential voltage and the output differential voltage; a comparator comparing the magnitude between the input differential voltage and the output differential voltage from which the common mode voltage components are removed; and an adjustment current generator generating an adjustment current used to adjust the output of the variable current source included in the calibration limiter according to the output voltage of the comparator.

The adjustment current generator may be a MOSFET having a gate through which the output voltage of the comparator is received, a source connected to a power supply voltage, and a drain through which the adjustment current is output.

The received signal strength indicator may further include a direct current calibration section including: a calibration rectifier equal to the rectifier included in the rectification section, and applied with a bias current without an input of a signal to be rectified; a calibration resistor connected to an output terminal of the calibration rectifier; a comparator comparing a voltage of the output terminal of the calibration rectifier with a predetermined reference voltage, and outputting a voltage corresponding to the difference; and a calibration current generator supplying a calibration direct current to the output terminal of the calibration rectifier according to the output of the comparator, and the calibration direct current is supplied to output terminals of the plurality of rectifiers included in the rectification section.

The calibration resistor may have a resistance having the same magnitude as a magnitude obtained by multiplying a resistance of the load resistor by the number of rectifiers included in the rectification section.

The bias current applied to the calibration rectifier may be a common mode voltage of the differential voltage output from the calibration limiter.

The calibration current generator may be a MOSFET having a gate through which the output voltage of the comparator is received, a source connected to a power supply voltage, and a drain connected to the output terminal of the calibration rectifier.

The rectification section may further include a plurality of MOSFETs each having a gate through which the output voltage of the comparator is received, a source connected to a power supply voltage, and a drain connected to an output terminal of each of the plurality of rectifiers.

BRIEF DESCRIPTION OF THE DRAWINGS

The above and other aspects, features and other advantages of the present invention will be more clearly understood from the following detailed description taken in conjunction with the accompanying drawings, in which:

FIGS. 7A and 7B are graphs illustrating a comparison in variations of direct current outputs between a rectifier of a general received signal strength indicator and a rectifier of a received signal strength indicator according to an exemplary embodiment of the invention.

DETAILED DESCRIPTION OF THE PREFERRED EMBODIMENT

Figure 1:
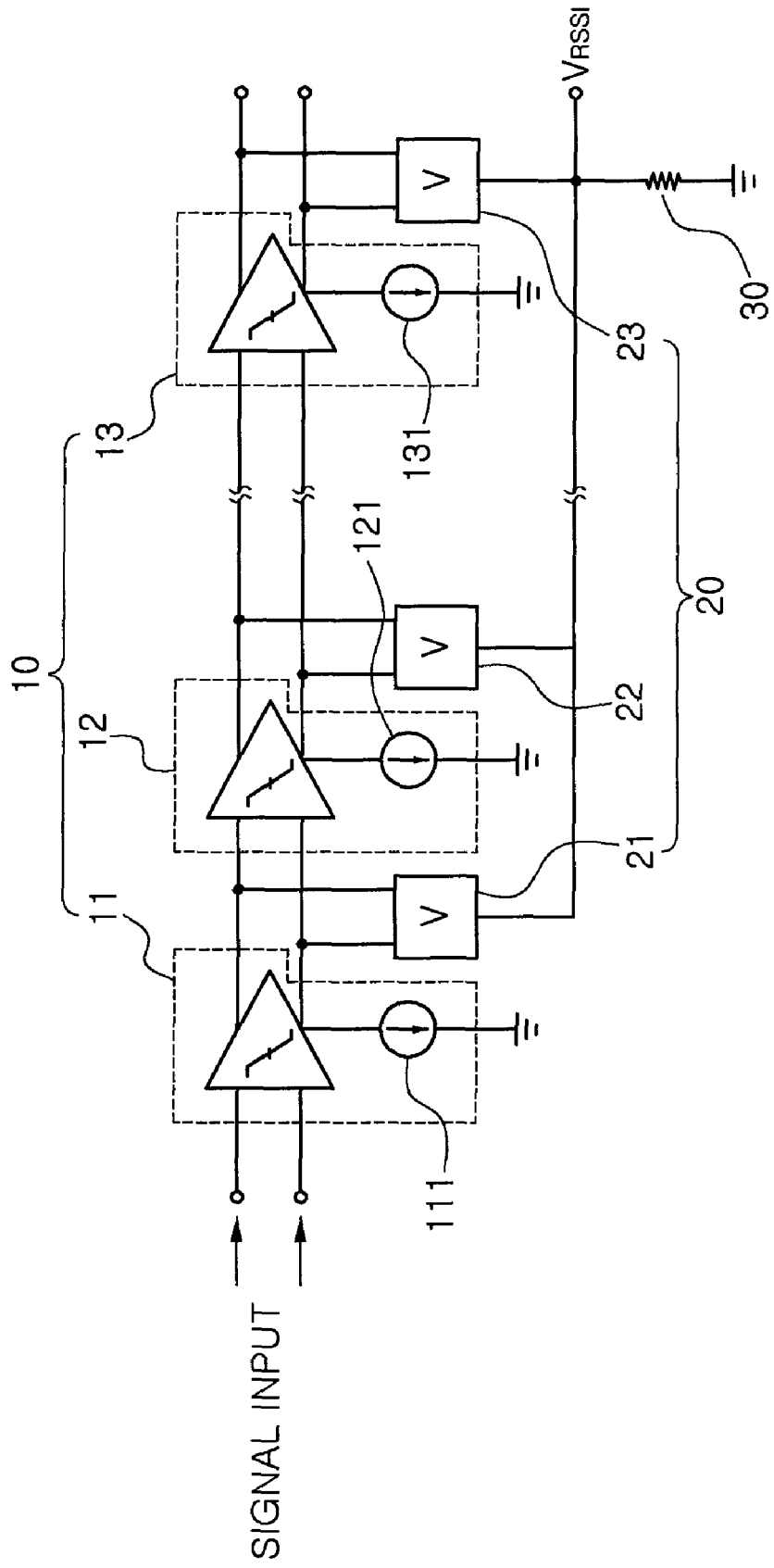
FIG. 1 is a circuit diagram illustrating a general received signal strength indicator.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a circuit diagram schematically illustrating a general received signal strength indicator (RSSI). Referring to FIG. 1, the RSSI includes a multi-stage amplification section 10, a rectification section 20, and a load resistor 30. The multi-stage amplification section 10 includes a plurality of limiters 11, 12, and 13 connected in series with each other to amplify a received signal in multiple stages. The rectification section 20 includes a plurality of rectifiers 21, 22, 23 that rectify outputs of the plurality of limiters 11, 12, and 13, respectively, to output direct currents. The load resistor 30 adds up the direct currents that are output from the plurality of rectifiers 21, 22, and 23, and converts the added direct currents into a voltage.

Each of the plurality of limiters 11, 12, and 13 receives a differential signal, amplifies the differential signal with a predetermined gain, and outputs a differential signal. The plurality of limiters 11, 12, and 13 included in the multi-stage amplification section 10 may have the same configuration. When the multi-stage amplification section 10 is only formed of one limiter, if an amplification ratio is high, then, a signal level is immediately saturated. On the other hand, if the amplification ratio is low, then, it takes a large amount of time to amplify the signal to a desired level. As a result, it is difficult to obtain appropriate linearity with respect to input and output characteristics. Preferably, the multi-stage amplification section 10 includes the plurality of limiters 11, 12, and 13 that are connected in series with each other. Further, the plurality of limiters 11, 12, and 13 may include variable current sources 111, 121, and 131, respectively, which can self-calibrate gains. That is, each of the limiters 11, 12, and 13 can implement a desired gain by causing an appropriate amount of current to flow through each of the variable current sources 111, 112, and 133.

The plurality of rectifiers 21, 22, and 23 receive the differential signals that are output from the plurality of limiters 11, 12, and 13, respectively, and rectify the output differential signals, and output the direct currents corresponding to the rectified out differential signals.

The load resistor 30 adds up the direct currents that are output from the plurality of rectifiers 21, 22, and 23, and converts a value of the added currents into a voltage value. A voltage $V_{RSSI}$ obtained by the conversion of the load resistor 30 corresponds to a value corresponding to the strength of the received signal that is input to the RSSI.

As described in the Background of the Invention, in the general RSSI configuration, variations of a gain of each of the limiters 11, 12, and 13 are caused by analog IC process or temperature variations. That is, the gains of the limiters 11, 12, and 13, which are determined in designing the circuit, are not obtained, but variations occur in the gains due to the process or temperature variations. Further, variations of the output direct currents of the plurality of rectifiers 21, 22, and 23 may also be caused by DC offset caused by the analog IC process or temperature variations. In the RSSI according to this embodiment, elements are included to compensate for the variations of the limiters 11, 12, and 13 and the variations of the rectifiers 21, 22, and 23.

First, the configuration for calibrating the gain of each of the limiters 11, 12, and 13, and the operation thereof will be described.

Figure 2:
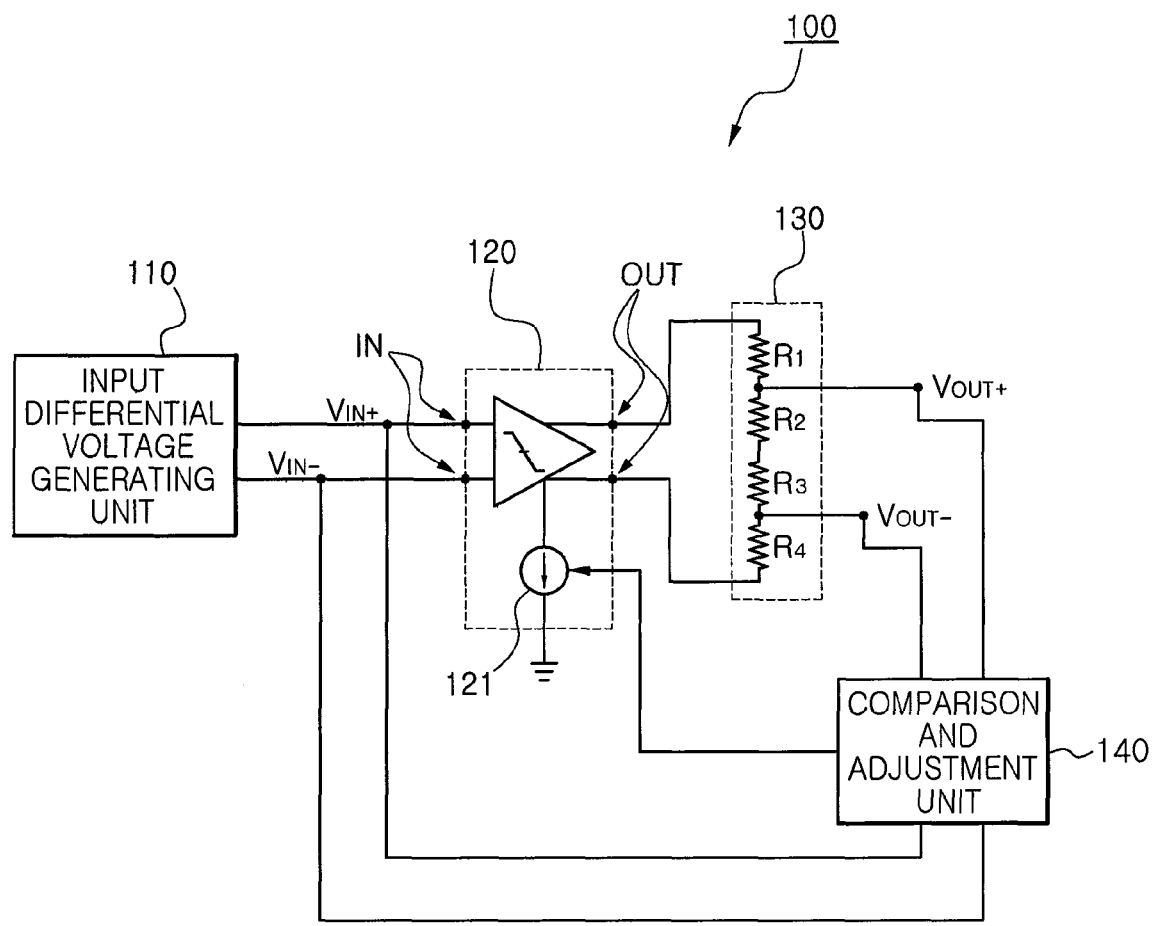
FIG. 2 is a block diagram illustrating a configuration of a gain calibration section of a received signal strength indicator according to an exemplary embodiment of the invention.

In this embodiment, in order to calibrate the gain of each of the limiters 11, 12, and 13, a gain calibration section 100, shown in FIG. 2, is provided. FIG. 2 is a block diagram illustrating a configuration of a gain calibration section of an RSSI according to an exemplary embodiment of the invention.

Referring to FIGS. 1 and 2, the gain calibration section 100 according to this embodiment includes an input differential voltage generating unit 110, a calibration limiter 120, a calibration load unit 130, and a comparison and adjustment unit 140.

The calibration limiter 120 is the same as each of the limiters 11, 12, and 13 included in the multi-stage amplification section 10. One of the limiters 11, 12, and 13 included in the multi-stage amplification section 10 may be replicated and used as the calibration limiter 120. A predetermined differential voltage is input to the calibration limiter 120. The input differential voltage that is input to the calibration limiter 120 can be generated from the input differential voltage generating unit 110. The input differential voltage generating unit 110 is an element that generates a differential voltage that may be a predetermined basis. A generally known band-gap reference circuit may be used as the input differential voltage generating unit 110. Preferably, the predetermined input differential voltage may be a differential voltage having a magnitude within a range where the calibration limiter 120 can linearly operate. When the magnitude of the input differential voltage does not satisfy the linear operation range of the calibration limiter 120, the limiter does not perform the amplification. Preferably, the input differential voltage has the largest possible value within the range in which the calibration limiter 120 performs the linear operation. When the magnitude of the input differential voltage is too small, it may be greatly affected by DC offset generated from the limiter itself.

When the predetermined input differential voltages are input to the calibration limiter 120, the calibration load unit 130 is connected to two output terminals OUT of the calibration limiter 120 to generate an output differential voltage whose gain is a unit gain. In a preferred embodiment, the calibration load unit 130 may include four resistors R1 to R4 that are connected in series to each other between the two output terminals OUT of the calibration limiter 120. When four resistors, connected in series to each other from one output terminal to the other output terminal of the calibration limiter 120, are the four resistors R1 to R4 in a sequential order, the first to fourth resistors $R_1$ and $R_4$ have the same resistance, and the second and third resistors $R_2$ and $R_3$ have the same resistance. Here, the resistances of the resistors $R_1$ to $R_4$ may be determined such that a voltage at a connection node between the first and second resistors $R_1$ and $R_2$ and a voltage at a connection node between the third and fourth resistors $R_3$ and $R_4$ become the output differential voltages. For example, when each of the first to fourth resistors $R_1$ and $R_4$ has a resistance of RV1, each of the second and third resistors $R_2$ and $R_3$ has a resistance of RV2, and the calibration limiter 120 has its own gain Av, in order to determine a gain between an input differential voltage $V_{IN+}$ and $V_{IN-}$ and an output differential voltage $V_{OUT+}$ and $V_{OUT-}$ of the calibration limiter 120 to be a unit gain, that is, 1, the following Equation 1 needs to be satisfied.

$$Av = 1 + \frac{RV1}{RV2} \qquad \text{[Equation 1]}$$

When the resistances of the four resistors R1 to R4 are determined to satisfy the Equation 1, the gain between the input differential voltage $V_{IN+}$ and $V_{IN-}$ and the output differential voltage $V_{OUT+}$ and $V_{OUT-}$ can be a unit gain.

Figure 3:
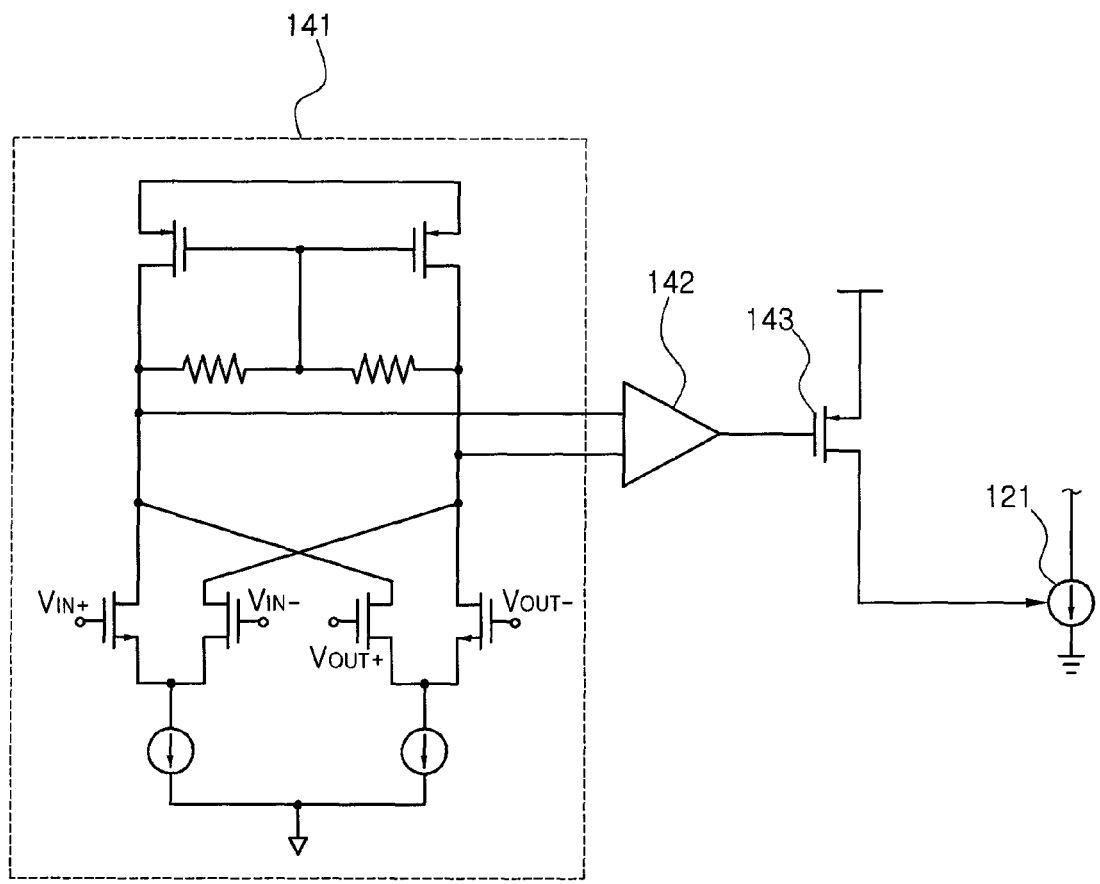
FIG. 3 is a detailed circuit diagram illustrating a comparison and adjustment unit of the received signal strength indicator according to the exemplary embodiment of the invention.

The comparison and adjustment unit 140 compares the input differential voltage $V_{IN+}$ and $V_{IN-}$ and the output differential voltage $V_{OUT+}$ and $V_{OUT-}$, and generates an adjustment current to adjust the output of the variable current source 121 included in the calibration limiter 120 so that the input differential voltage $V_{IN+}$ and $V_{IN-}$ is the same as the output differential voltage $V_{OUT+}$ and $V_{OUT-}$. FIG. 3 is a detailed circuit diagram illustrating the comparison and adjustment unit 140.

Referring to FIG. 3, the comparison and adjustment unit 140 includes a Gilbert cell 141, a comparator 142, and an adjustment current generator 143. The Gilbert cell 141 removes a common mode voltage component from each of the input differential voltage $V_{IN+}$ and $V_{IN-}$ and the output differential voltage $V_{OUT+}$ and $V_{OUT-}$. The comparator 142 compares the magnitude between the input differential voltage $V_{IN+}$ and $V_{IN-}$ and the output differential voltage $V_{OUT+}$ and $V_{OUT-}$, from which the common mode voltage components are removed. Then, the comparator 142 outputs a voltage corresponding to the difference. The adjustment current generator 143 adjusts the output of the variable current source 121 included in the calibration limiter 120 according to the voltage that is output from the comparator 142.

The input differential voltage $V_{IN+}$ and $V_{IN-}$ and the output differential voltage $V_{OUT+}$ and $V_{OUT-}$ may have different common mode voltages from each other. Therefore, after the common mode voltage component is removed from each of the input and output differential voltages, a difference between a minimum/maximum voltage $V_{IN+}$ and $V_{IN-}$ corresponding to the input differential voltage needs to be compared with a difference between the minimum/maximum voltage $V_{OUT+}$ and $V_{OUT-}$ corresponding to the output differential voltage. In order to remove the different common mode voltage components, a Gilbert Cell, as known in the art, is used in the comparison and adjustment unit 140 of the RSSI in the embodiment of the invention.

The comparator 142 compares the magnitude between the input differential voltage $V_{IN+}$ and $V_{IN-}$ and the output differential voltage $V_{OUT+}$ and $V_{OUT-}$, from which the common mode voltage components are removed. Then, the comparator 142 outputs the voltage corresponding to the difference.

The adjustment current generator 143 may be implemented as a MOSFET 143. The MOSFET 143 has a gate through which the output voltage from the comparator 142 is input, a source connected to a power supply voltage, and a drain through which the adjustment current is output. That is, the MOSFET 143 has the gate through which the voltage corresponding to the difference between the input differential voltage $V_{IN+}$ and $V_{IN-}$ and the output differential voltage $V_{OUT+}$ and $V_{OUT-}$ is received from the comparator 142. Then, the MOSFET 143 adjusts the magnitude of the output of the variable current source 121 included in the calibration limiter 120 according to the magnitude of the comparator 142. For example, as a result of the comparison performed by the comparator 142, if the output differential voltage $V_{OUT+}$ and $V_{OUT-}$ is greater than the input differential voltage $V_{IN+}$ and $V_{IN-}$ (that is, when a gain is greater than a unit gain), the output voltage of the comparator 142 increases, and the adjustment current of the MOSFET 143 correspondingly decreases. If the amount of current flowing through the variable current source 121 decreases, the gain of the calibration limiter 120 can be reduced. On the other hand, as a result of the comparison of the comparator 142, when the output differential voltage $V_{OUT+}$ and $V_{OUT-}$ is smaller than the input differential voltage $V_{IN+}$ and $V_{IN-}$ (that is, when a gain is smaller than a unit gain), the output voltage of the comparator 142 is reduced, and the adjustment current of the MOSFET 143 increases correspondingly. Here, if the amount of the current flowing through the variable current source 121 increases, the gain of the calibration limiter 120 can be increased.

Figure 5:
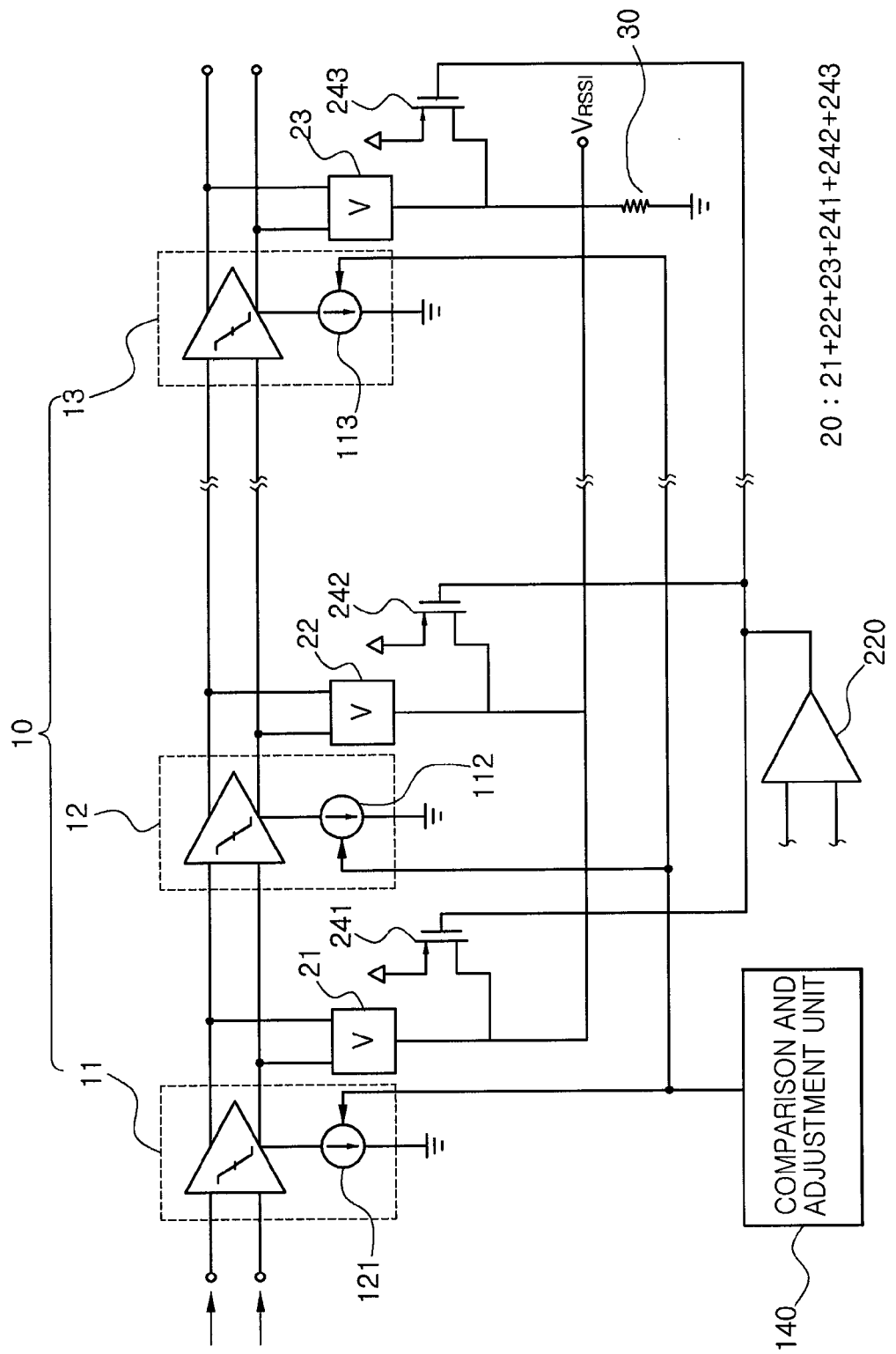
FIG. 5 is a circuit diagram illustrating the received signal strength indicator according to an exemplary embodiment of the invention.

As shown in FIG. 5, the adjustment current used to adjust the output of the variable current source 121 included in the calibration limiter 120 is not only supplied to the calibration limiter 120 but also to the variable current sources 111, 121, and 131 of the limiters 11, 12, and 13 that are included in the multi-stage amplification section 10 of the RSSI. FIG. 5 is a circuit diagram illustrating a received signal strength indicator according to an exemplary embodiment of the invention. The calibration limiter 120 is the same as the limiters 11, 12, and 13 that are included in the multi-stage amplification section 10. The adjustment current is used to maintain a constant gain of the calibration limiter 120 with the gain variations of the calibration limiter 120. Therefore, the gains of the limiters 11, 12, and 13 included in the multi-stage amplification section 10 may also be adjusted in the same manner as the calibration limiter 120. That is, the gain variations of the limiters 11, 12, and 13 included in the multi-stage amplification section 10 can be calibrated using the adjustment current.

The configuration and operation of compensating for variations of the direct current outputs of the rectifiers 21, 22, and 23 included in the rectification section 20 will now be described.

Figure 4:
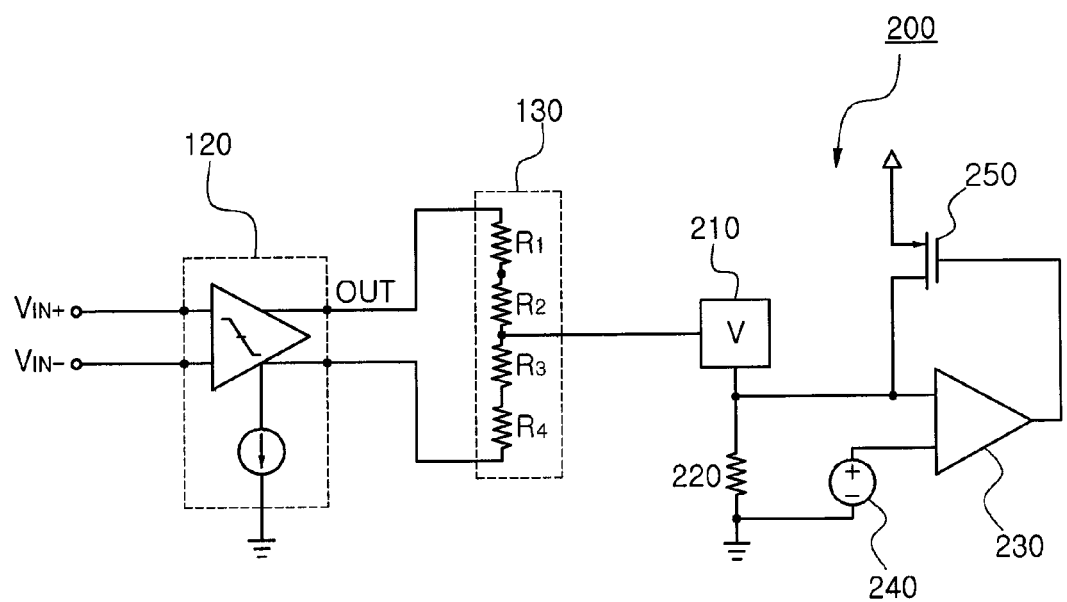
FIG. 4 is a detailed circuit diagram illustrating a direct current calibration section according to an exemplary embodiment of the invention.

FIG. 4 is a circuit diagram illustrating a direct current calibration section according to an exemplary embodiment of the invention. In the embodiment of the invention, in order to compensate for the variations the direct current currents that are output from the rectifiers 21, 22, and 23 in the rectification section 20, a direct current calibration section 200, shown in FIG. 4, is provided. The direct current calibration section 200 according to the embodiment of the invention is the same as the rectifiers 21, 22, and 23 included in the rectification section 20 of the RSSI. The direct current calibration section 200 includes a calibration rectifier 210, a calibration resistor 220, a comparator 230, and a calibration current generator 250. The calibration rectifier 210 is supplied with a bias current but is not supplied with a signal to be rectified. The calibration resistor 220 is connected to an output terminal of the calibration rectifier 210. The comparator 230 compares a voltage at the output terminal of the calibration rectifier 210 with a predetermined reference voltage 240, and outputs a voltage corresponding to the difference. A calibration current generator 250 supplies a calibration direct current to the output terminal of the calibration rectifier 210 according to the output of the comparator 230.

As the calibration rectifier 210, a rectifier having the same configuration as the rectifiers 21, 22, and 23 included in the rectification section 20 of the RSSI is used. A bias current is only supplied to the calibration rectifier 210, while an input signal to be rectified is not supplied to the calibration rectifier 210. That is, the calibration rectifier 210 is provided to supply a DC offset current that is output when there is no input signal to be rectified and only the bias current is supplied. The bias current applied to the calibration rectifier 210 may be supplied by using a common mode voltage of the differential voltage that is output through the output terminals of the calibration limiter 120 included in the gain calibration section 100 as shown in FIG. 4.

The calibration resistor 220 is connected to the output terminal of the calibration rectifier 210, and detects the DC offset current, output from the calibration rectifier 210, as a voltage value. That is, the calibration resistor 220 is used to detect a voltage of the output terminal of the calibration rectifier 210 to which the bias current is applied but a signal is input. Preferably, the calibration resistor 220 may have a resistance that is obtained by multiplying a resistance of the load resistor 30 by the number of rectifiers 21, 22, and 23 included in the rectification section 20. Here, the load resistor 30 is provided to add up the currents that are output from the rectifiers 21, 22, and 23 of the rectification section 20 of the RSSI, and detect the added direct currents as the voltage value $V_{RSSI}$. As a result, a voltage of the output terminal of the calibration rectifier 210 becomes identical to the voltage of the output terminal of each of the rectifiers 21, 22, and 23 when no input signal is applied to each of the rectifiers 21, 22, and 23 of the rectification section 20 of the RSSI.

The comparator 230 compares the predetermined reference voltage 240 with the voltage at the output terminal of the calibration rectifier 210 that is detected by the calibration resistor 220, and then outputs a voltage corresponding to the comparison result.

The calibration current generator 250 may be formed of a MOSFET 250. The MOSFET 250 includes a gate through which the output voltage of the comparator 230 is received, a source that is connected to a power supply voltage, and a drain that is connected to the output terminal of the calibration rectifier 210. The MOSFET 250 supplies the calibration direct current to the output terminal of the calibration rectifier 210. The calibration current generator 250 has a gate through which a voltage corresponding to the difference between the reference voltage 240 and the voltage at the output terminal of the calibration rectifier 210 is received from the comparator 230. Further, the calibration current generator 250 adjusts a resistance between a drain and a source according to the output voltage of the magnitude of the voltage received through the gate, thereby adjusting the magnitude of the calibration direct current that is supplied to the output terminal of the calibration rectifier 210. The voltage at the outer terminal of the calibration rectifier 210 remains constant as the reference voltage 240 by the calibration current generator 250. That is, the direct current output of the calibration rectifier 210 can remain constant.

The calibration direct current that is generated from the calibration current generator 250 is mirrored, so that the same magnitude of current is supplied to each of the output terminals of the plurality of rectifiers 21, 22, and 23 of the rectification section 20 included in the RSSI. To this end, as shown in FIG. 5, the rectification section 20 of the RSSI may also include a plurality of MOSFETs 241, 242, and 243. Each of the MOSFETs 241, 242, and 243 has a gate through which the voltage, output from the comparator 230, is received, a source connected to a power source voltage, and a drain connected to the output terminal of the rectifier included in the rectification section 20. According to this configuration, the calibration direct current that is the same as the current supplied to the output terminal of the calibration rectifier 210 is supplied to the output terminal of each of the rectifiers 21, 22, and 23, so that the direct current output of the rectifiers can remain constant.

Figures 6A, 6B:
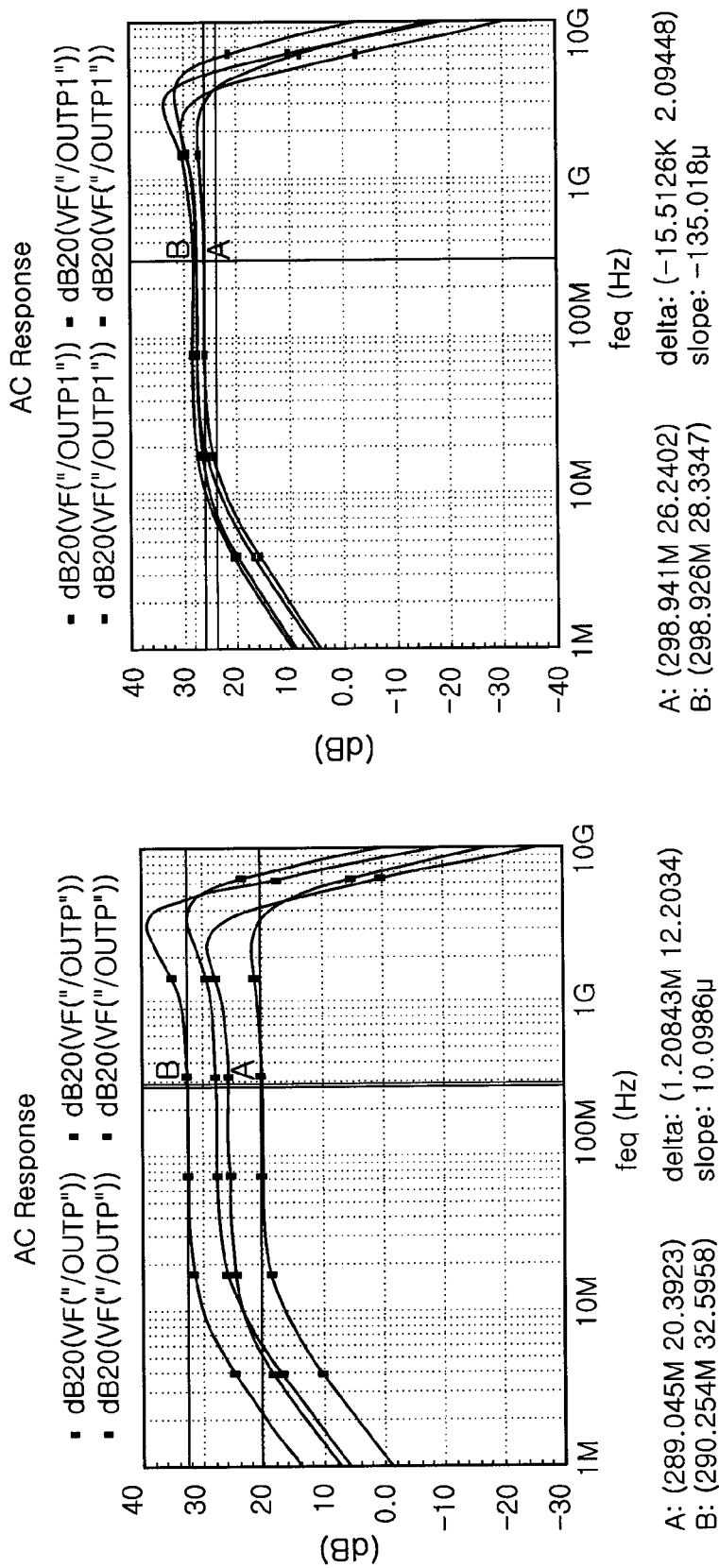
FIGS. 6A and 6B are graphs illustrating a comparison in gain variations between a limiter of a general received signal strength indicator and a limiter of a received signal strength indicator according to an exemplary embodiment of the invention.

FIGS. 6A and 6B are graphs illustrating a comparison in gain variations between a limiter of a general received signal strength indicator and a limiter of a received signal strength indicator according to an exemplary embodiment of the invention. FIGS. 7A and 7B are graphs illustrating a comparison in variations of direct current outputs between a rectifier of a general received signal strength signal and a rectifier of a received signal strength signal according to an exemplary embodiment of the invention.

As shown in FIG. 6A, the limiter of the general RSSI is shown to have great variations of outputs over temperature that are caused by gain variations over temperature. On the other hand, the gain of the limiter of the RSSI is shown to have significantly reduced variations of outputs in the embodiment of the invention calibrated since the gain is calibrated by the gain calibration section as shown in FIG. 6B.

In the same manner, as shown in FIG. 7A, the rectifier of the general RSSI is shown to have great variations of the output current over temperature. On the other hand, as shown in FIG. 7B, the rectifier of the RSSI is shown to have significantly reduced variations of the direct current, output from the rectifier, by using the direct current calibration section in the embodiment of the invention.

As set forth above, according to the exemplary embodiment of the invention, gain variations of a received signal strength indicator can be accurately self-calibrated by detecting gain variations of a limiter, which are caused by temperature or process variations, by using a limiter that is the same as the limiter applied to the received signal strength indicator. Further, according to the exemplary embodiment of the invention, variations of direct current outputs of a rectifier can be accurately self-calibrated by detecting the direct current output variations of the rectifier, which are caused by temperature or process variations, by using a rectifier that is the same as the rectifier applied to the received signal strength indicator.

Accordingly, the received signal strength indicator can have improved signal strength indication.

While the present invention has been shown and described in connection with the exemplary embodiments, it will be apparent to those skilled in the art that modifications and variations can be made without departing from the spirit and scope of the invention as defined by the appended claims.

What is claimed is:

1. A received signal strength indicator, comprising:
   a multi-stage amplification section including a plurality of limiters connected in series to each other and individually having variable current sources for calibrating gains;
   a rectification section comprising a plurality of rectifiers configured for receiving and rectifying an output of each of the plurality of limiters, and outputting a direct current corresponding to the output;
   a load resistor converting the direct currents output from the plurality of rectifiers into a voltage; and
   a gain calibration section comprising:
      a calibration limiter, the calibration limiter corresponding to at least one of the plurality of limiters included in the multi-stage amplification section;
      a calibration load unit connected to output terminals of the calibration limiter, and generating an output differential voltage whose gain is a unit gain when a predetermined input differential voltage is input to the calibration limiter; and
      a comparison and adjustment unit comparing the input differential voltage with the output differential voltage, and generating an adjustment current for adjusting an output of a variable current source included in the calibration limiter so that the input differential voltage becomes identical to the output differential voltage,
   wherein the adjustment current generated from the gain calibration section is supplied to the variable current sources of the plurality of limiters included in the multi-stage amplification section.

2. The received signal strength indicator of claim 1, wherein the input differential voltage has a magnitude within a range where the calibration limiter performs a linear operation.

3. The received signal strength indicator of claim 1, wherein the calibration load unit comprises a plurality of resistors connected in series to each other between the output terminals of the calibration limiter.

4. The received signal strength indicator of claim 3, wherein the plurality of resistors comprise:
   a first resistor having one end connected to one output terminal of the calibration limiter;
   a second resistor having one end connected to the other end of the first resistor;
   a third resistor having one end connected to the other end of the second resistor; and
   a fourth resistor having one end connected to the other end of the third resistor and the other end connected to the other output terminal of the calibration limiter, and
   the first and fourth resistors have the same magnitude, the second and third resistors have the same magnitude, and a voltage at a connection node between the first and second resistors and a voltage at a connection node between the third and fourth resistors become the output differential voltages.

5. The received signal strength indicator of claim 1, wherein the comparison and adjustment unit comprises:
   a Gilbert cell removing a common mode voltage component of each of the input differential voltage and the output differential voltage;
   a comparator comparing the magnitude between the input differential voltage and the output differential voltage from which the common mode voltage components are removed; and
   an adjustment current generator generating the adjustment current used to adjust the output of the variable current source included in the calibration limiter according to the output voltage of the comparator.

6. The received signal strength indicator of claim 5, wherein the adjustment current generator is a MOSFET having a gate through which the output voltage of the comparator is received, a source connected to a power supply voltage, and a drain through which the adjustment current is output.

7. The received signal strength indicator of claim 1, further comprising a direct current calibration section comprising:
   a calibration rectifier corresponding to at least one of the rectifiers included in the rectification section, and applied with a bias current without an input of a signal to be rectified;
   a calibration resistor connected to an output terminal of the calibration rectifier;
   a comparator comparing a voltage of the output terminal of the calibration rectifier with a predetermined reference voltage, and outputting a voltage corresponding to the difference; and
   a calibration current generator supplying a calibration direct current to the output terminal of the calibration rectifier according to the output of the comparator, and
   the calibration direct current is supplied to output terminals of the plurality of rectifiers included in the rectification section.

8. The received signal strength indicator of claim 7, wherein the calibration resistor has a resistance having the same magnitude as a magnitude obtained by multiplying a resistance of the load resistor by the number of rectifiers included in the rectification section.

9. The received signal strength indicator of claim 7, wherein the bias current applied to the calibration rectifier is a common mode voltage of the differential voltage output from the calibration limiter.

10. The received signal strength indicator of claim 7, wherein the calibration current generator is a MOSFET having a gate through which the output voltage of the comparator is received, a source connected to a power supply voltage, and a drain connected to the output terminal of the calibration rectifier.

11. The received signal strength indicator of claim 10, wherein the rectification section further comprises a plurality of MOSFETs each having a gate through which the output voltage of the comparator is received, a source connected to a power supply voltage, and a drain connected to an output terminal of each of the plurality of rectifiers.

* * * * *